US011816353B2

(12) United States Patent
Sharma

(10) Patent No.: US 11,816,353 B2
(45) Date of Patent: Nov. 14, 2023

(54) PARITY DATA FOR NON-VOLATILE STORAGE

(71) Applicant: Western Digital Technologies, Inc., San Jose, CA (US)

(72) Inventor: Varun Sharma, Ghaziabad (IN)

(73) Assignee: Western Digital Technologies, Inc., San Jose, CA (US)

(*) Notice: Subject to any disclaimer, the term of this patent is extended or adjusted under 35 U.S.C. 154(b) by 165 days.

(21) Appl. No.: 17/555,957

(22) Filed: Dec. 20, 2021

(65) Prior Publication Data

US 2023/0195357 A1 Jun. 22, 2023

(51) Int. Cl.
*G11C 16/34* (2006.01)
*G06F 3/06* (2006.01)

(52) U.S. Cl.
CPC .......... *G06F 3/0655* (2013.01); *G06F 3/0604* (2013.01); *G06F 3/0679* (2013.01); *G11C 16/3459* (2013.01)

(58) Field of Classification Search
CPC .... G06F 3/0655; G06F 3/0604; G06F 3/0679; G06F 11/10; G11C 16/3459; G11C 29/52; G11C 11/4528; G11C 16/0483; G11C 16/10; G11C 2029/0411
USPC .................................................... 714/80, 803
See application file for complete search history.

(56) References Cited

U.S. PATENT DOCUMENTS 6,134,699 A * 10/2000 Steenburgh ......... G06F 11/1064 714/53
7,085,986 B2 * 8/2006 Nefedov ........... H03M 13/2714 714/755
8,132,086 B2 * 3/2012 Park .................... G06F 11/1044 714/801
8,250,430 B2 * 8/2012 Nishi .................... H04L 1/0052 714/755
8,386,861 B2 2/2013 Chen
8,750,042 B2 6/2014 Sharon et al.
8,862,967 B2 * 10/2014 Pancholi ........... H03M 13/6318 714/760
8,972,675 B2 3/2015 Avila et al.
9,165,683 B2 10/2015 Tam
9,201,718 B2 12/2015 Larsen et al.
10,275,310 B2 4/2019 B et al.
(Continued)

*Primary Examiner* — Albert Decady
*Assistant Examiner* — Enam Ahmed
(74) *Attorney, Agent, or Firm* — Vierra Magen Marcus LLP

(57) ABSTRACT

Technology is disclosed herein for managing parity data in non-volatile memory. As user data is programming into respective groups of non-volatile memory cells, the system accumulates parity data. The system may accumulate XOR parity based on successive bitwise XOR operations of user data. After programming is complete, the system performs a post-program read test of the data stored into each respective group of memory cells. The system re-calculates the parity data such that the parity data is no longer based on the user data that was stored in any group of memory cells for which the post-program read test failed. For example, the system will perform an additional bitwise XOR between the accumulated XOR parity data with the user data that was stored in the group of memory cells for which the post-program read test failed. The parity data is programmed to a group of memory cells.

20 Claims, 15 Drawing Sheets

(56) References Cited

U.S. PATENT DOCUMENTS

| | | | | |
|---|---|---|---|---|
| 10,754,725 | B2 | 8/2020 | Amato et al. | |
| 10,872,012 | B2 | 12/2020 | Subramanian et al. | |
| 10,922,025 | B2 | 2/2021 | Berman et al. | |
| 2003/0037281 | A1 * | 2/2003 | Hitz | G11B 20/1833 714/E11.034 |
| 2003/0147286 | A1 * | 8/2003 | Tanaka | G11C 16/3454 365/185.17 |
| 2006/0095897 | A1 * | 5/2006 | Kawai | G06F 8/433 717/140 |
| 2009/0013240 | A1 * | 1/2009 | Argon | H03M 7/14 714/803 |
| 2023/0112636 | A1 * | 4/2023 | Doni | G06F 3/0626 711/103 |

* cited by examiner

| | | | Memory Die 0 | | Memory Die 1 | |
|---|---|---|---|---|---|---|
| WL | Sub-block | LWL | Plane 0 | Plane 1 | Plane 0 | Plane 1 |
| 0 | 0 | 0 | 0 | 12 | 0 | 12 |
| | 1 | 1 | 1 | 13 | 1 | 13 |
| | 2 | 2 | 2 | 14 | 2 | 14 |
| | 3 | 3 | 3 | 15 | 3 | 15 |
| 1 | 0 | 4 | 4 | 8 | 4 | 8 |
| | 1 | 5 | 5 | 9 | 5 | 9 |
| | 2 | 6 | 6 | 10 | 6 | 10 |
| | 3 | 7 | 7 | 11 | 7 | 11 |
| 2 | 0 | 8 | 0 | 12 | 0 | 12 |
| | 1 | 9 | 1 | 13 | 1 | 13 |
| | 2 | 10 | 2 | 14 | 2 | 14 |
| | 3 | 11 | 3 | 15 | 3 | 15 |

802a

802

⋮

| | | | | | | |
|---|---|---|---|---|---|---|
| 62 | 0 | 248 | 0 | 12 | 0 | 12 |
| | 1 | 249 | 1 | 13 | 1 | 13 |
| | 2 | 250 | 2 | 14 | 2 | 14 |
| | 3 | 251 | 3 | 15 | 3 | 15 |
| 63 | 0 | 252 | 4 | 8 | 4 | 8 |
| | 1 | 253 | 5 | 9 | 5 | 9 |
| | 2 | 254 | 6 | 10 | 6 | 10 |
| | 3 | 255 | 7 | 11 | 7 | 11 |

| | | | Memory Die 0 | | |
|---|---|---|---|---|---|
| | | | Plane 0 | | |
| WL | Sub-block | LWL | LP | MP | UP |
| 0 | 0 | 0 | SLC B0, 0 | SLC B1, 0 | SLC B2, 0 |
| | 1 | 1 | SLC B0, 1 | SLC B1, 1 | SLC B2, 1 |
| | 2 | 2 | SLC B0, 2 | SLC B1, 2 | SLC B2, 2 |
| | 3 | 3 | SLC B0, 3 | SLC B1, 3 | SLC B2, 3 |
| 1 | 0 | 4 | SLC B0, 4 | SLC B1, 4 | SLC B2, 4 |
| | 1 | 5 | SLC B0, 5 | SLC B1, 5 | SLC B2, 5 |
| | 2 | 6 | SLC B0, 6 | SLC B1, 6 | SLC B2, 6 |
| | 3 | 7 | SLC B0, 7 | SLC B1, 7 | SLC B2, 7 |
| 2 | 0 | 8 | SLC B0, 8 | SLC B1, 8 | SLC B2, 8 |
| | 1 | 9 | SLC B0, 9 | SLC B1, 9 | SLC B2, 9 |
| | 2 | 10 | SLC B0, 10 | SLC B1, 10 | SLC B2, 10 |
| | 3 | 11 | SLC B0, 11 | SLC B1, 11 | SLC B2, 11 |
| ⋮ | | | | | |
| 62 | 0 | 248 | 0 | 0 | 0 |
| | 1 | 249 | 1 | 1 | 1 |
| | 2 | 250 | 2 | 2 | 2 |
| | 3 | 251 | 3 | 3 | 3 |
| 63 | 0 | 252 | 4 | 4 | 4 |
| | 1 | 253 | 5 | 5 | 5 |
| | 2 | 254 | 6 | 6 | 6 |
| | 3 | 255 | 7 | 7 | 7 |

PARITY DATA FOR NON-VOLATILE STORAGE

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

Error correction algorithms may be used to correct errors in the stored data. An error correction code (ECC) encoder may generate parity bits based on the user data. The parity bits are stored in the non-volatile memory cells. An ECC codeword (or more briefly "codeword") that contains the user data and the parity bits is stored in the memory cells. An ECC decoder may be used to run an ECC algorithm to detect and correct errors in the data. However, there are limitations on how many errors can be corrected in an ECC codeword. Therefore, it is possible for decoding of the ECC codeword to fail.

In addition to storing the ECC codeword in the non-volatile storage system, the system may compute and store parity data. One technique is to accumulate XOR parity based on successive bitwise exclusive OR (XOR) operations of the data that is programmed into the memory cells. For example, initially a bitwise XOR is performed between the first two units of data that are programmed into the memory cells to form the initial XOR accumulation. Then, as each additional unit of data is programmed, a bitwise XOR is performed between the current XOR accumulation and the new data being programmed.

The parity data may be used to recover the user data in the event that the ECC decoder fails to decode the codeword, which is referred to herein as an unrecoverable by ECC decoder error (UECC). However, there are limits to how much user data can be recovered using parity data in the event of an UECC. If too many units of the user data incur an UECC, then the user data cannot be recovered even with the parity data.

BRIEF DESCRIPTION OF THE DRAWINGS

Like-numbered elements refer to common components in the different figures.

FIG. 8 is a table that shows locations in non-volatile memory for user data and parity data for one embodiment of managing parity data.

FIG. 9 is a table that represents how SLC data can be folded into MLC data.

DETAILED DESCRIPTION

Figure 1:
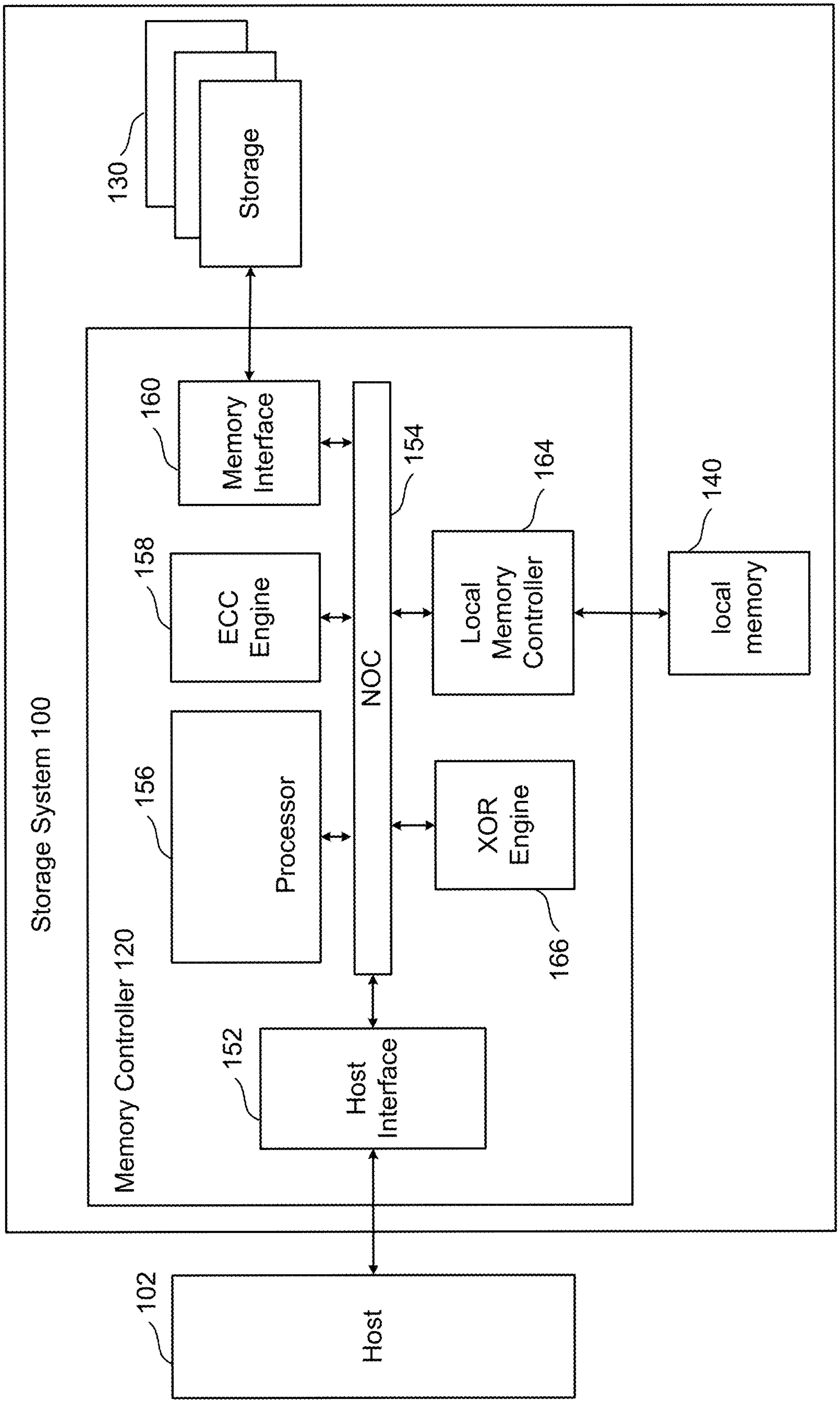
FIG. 1 is a block diagram depicting one embodiment of a storage system.

Technology is disclosed herein for managing parity data in non-volatile memory. In an embodiment, as user data is being programming into respective groups of non-volatile memory cells, the system accumulates parity data. As one example, the system accumulates XOR parity based on successive bitwise XOR operations of user data that is programmed into the groups of memory cells. Therefore, the parity data will be based on the user data programmed into each group of memory cells. After programming is complete, the system performs a post-program read test of the data stored into each respective group of memory cells. The post-program read test includes reading back the data that was programmed into each respective group. The system may run an ECC algorithm on the data to determine whether data is decodable, or to determine a bit error rate. As one example, if the data is undecodable then the post-program read test fails for a group of memory cells. The system will then recalculate the parity data such that the parity data is no longer based on the user data that was stored in the group of memory cells for which the post-program read test failed. In one embodiment, the system will perform an additional bitwise XOR between the XOR parity that was accumulated when programming was complete for all groups with the user data that was stored in the group of memory cells for which the post-program read test failed. This additional bitwise XOR serves to recalculate the XOR parity such that the XOR parity is no longer based on the user data that was stored in the group of memory cells for which the post-program read test failed. The parity data is programmed to a group of memory cells. Also, the data from any group that failed the post-program read test is programmed to a different group of memory cells (e.g., in a different block). Since the parity data is no longer based on the user data that was stored in the group of memory cells for which the post-program read test failed, the parity data can be used to recover other user data from the respective groups of non-volatile memory cells without the need to read and decode the user data from the group for which the post-program read test failed.

In some embodiments, parity data is calculated during a process of folding data from memory cells that store one bit per cell (SLC cells) to memory cells that store multiple bits per cell (MLC cells). For example, the data from three blocks of SLC cells may be folded to one block of MLC cells. In the event the data that was programmed to a group of MLC cells cannot be decoded in the post-program read test, that data can still be read (and decoded) from the SLC cells. In an embodiment, the system performs a bitwise XOR of the data read from the SLC cells with the accumulated XOR parity in order to recalculate the XOR parity such that the XOR parity is no longer based on the data that was stored in the group of memory cells for which the post-program read test failed.

Embodiments in which the system manages parity data can be especially useful for use with memory die or memory structures which are unusually susceptible to errors in the stored data, such that decoding an ECC codeword has a relatively high chance of failure. The management of parity data allows the use of memory die that have defects that could lead to errors in the stored data. Therefore, memory die that might otherwise be discarded may be used. However, embodiments of management of parity data are not limited to such memory die which are unusually susceptible to errors in the stored data.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables"). A portion of local high speed memory 140 may also be used as a parity buffer. For example, the memory controller may calculate parity data as user data is being programmed to the storage 130. The parity data may be temporarily stored in the local high speed memory 140 prior to writing the parity data to the storage 130.

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

XOR engine 166 computes parity data (or more briefly "parity") for data that is written to storage 130. The parity data may be temporarily stored in a parity buffer in local memory 140. In some embodiments, the parity data is repeatedly updated based on the latest data that is written to storage 130, which is referred to herein as accumulating parity data. In some embodiments, the XOR engine 166 accumulates XOR data by successively performing bitwise XOR operations on the data that is presently written to the storage 130 and present parity data in the local memory 140. The present parity data in the local memory 140 contains results of previous XOR operations. In other words, the XOR engine 166 may perform an XOR between data being transferred to storage 130 and the contents of some portion of the parity buffer, and then store the result back into that portion of the parity buffer. Therefore, the parity data in the local memory 140 may be updated as user data is being written to the storage 130. In some embodiments, the processor 156 provides the XOR engine o166 with addresses in the local memory 140. These addresses inform the XOR engine 166 of the locations in local memory 140 should be accessed to form the bitwise XOR, as well as where to store the result in local memory 140.

In one embodiment, XOR engine 166 is a custom and dedicated hardware circuit. In some embodiments, the XOR engine 166 is an electrical circuit programmed by software. For example, XOR engine 166 can be a processor that can be programmed. In one embodiment, the function of XOR engine 166 is implemented by processor 156. In some embodiments, the XOR engine comprises multiple engines, which are able to independently perform XOR operations.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
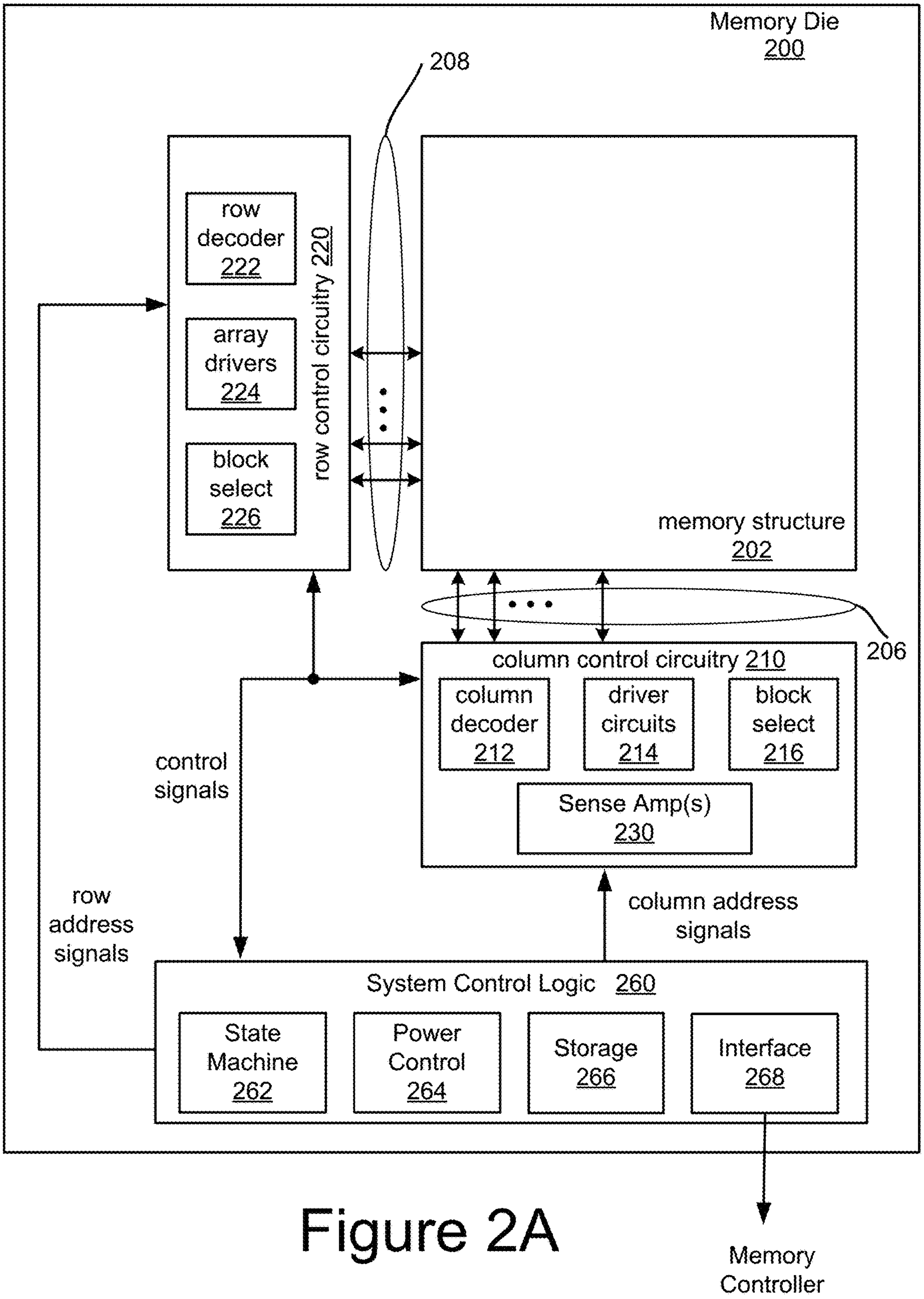
FIG. 2A is a block diagram of one embodiment of a memory die.

In one embodiment, non-volatile storage 130 comprises one or more memory die. Herein, the term "die" may be used in the singular or plural. FIG. 2A is a functional block diagram of one embodiment of a memory die 200 that comprises non-volatile storage 130. Each of the one or more memory die of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed die that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
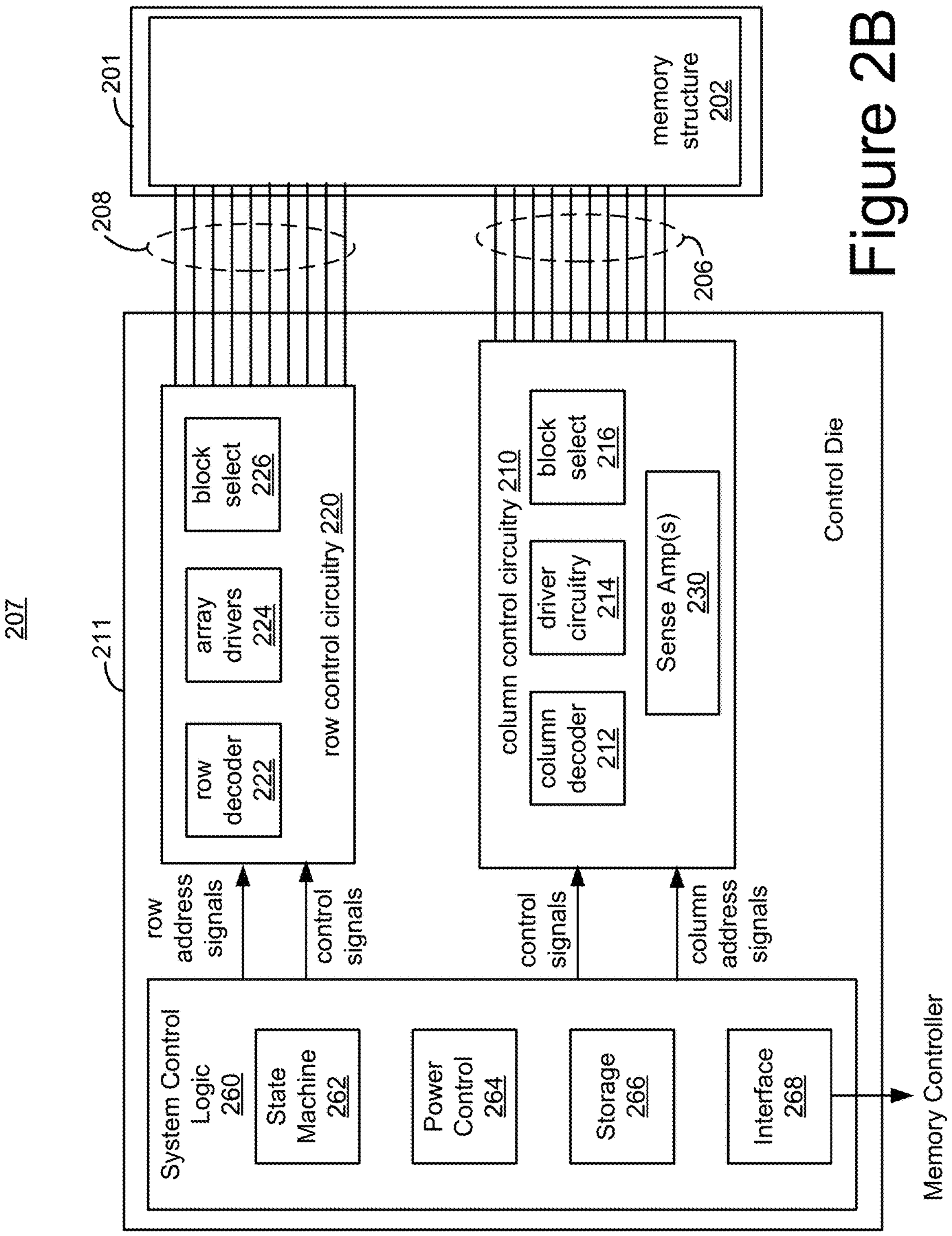
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor die (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense amps 230, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 2C:
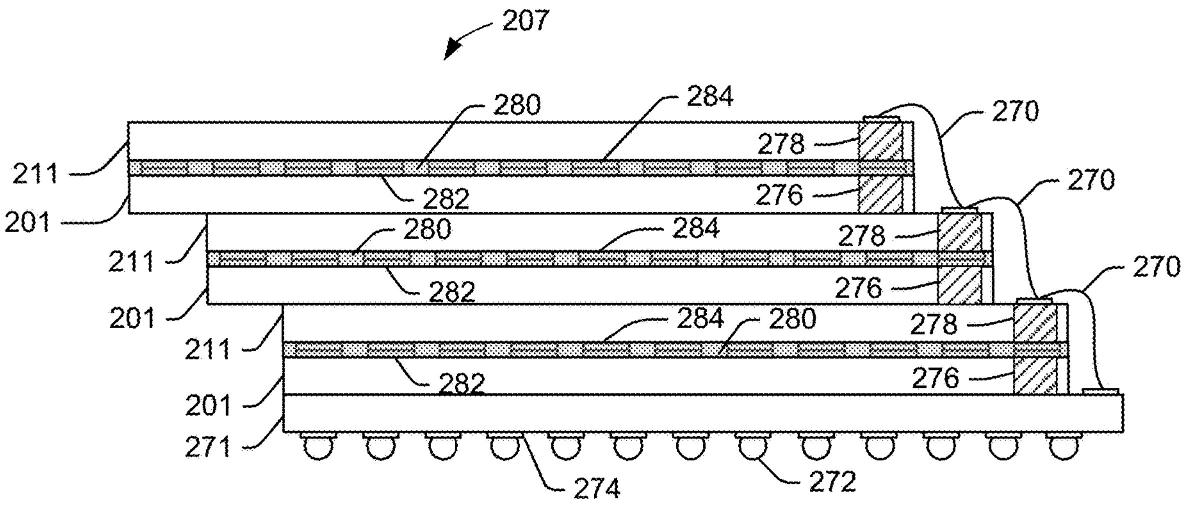
FIGS. 2C and 2D depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 2C depicts a side view of an embodiment of an integrated memory assembly 207 stacked on a substrate 271 (e.g., a stack comprising control die 211 and memory structure die). The integrated memory assembly 207 has three control die 211 and three memory die 201. In some embodiments, there are more than three memory die 201 and more than three control die 211.

Each control die 211 is affixed (e.g., bonded) to at least one of the memory die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor die 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
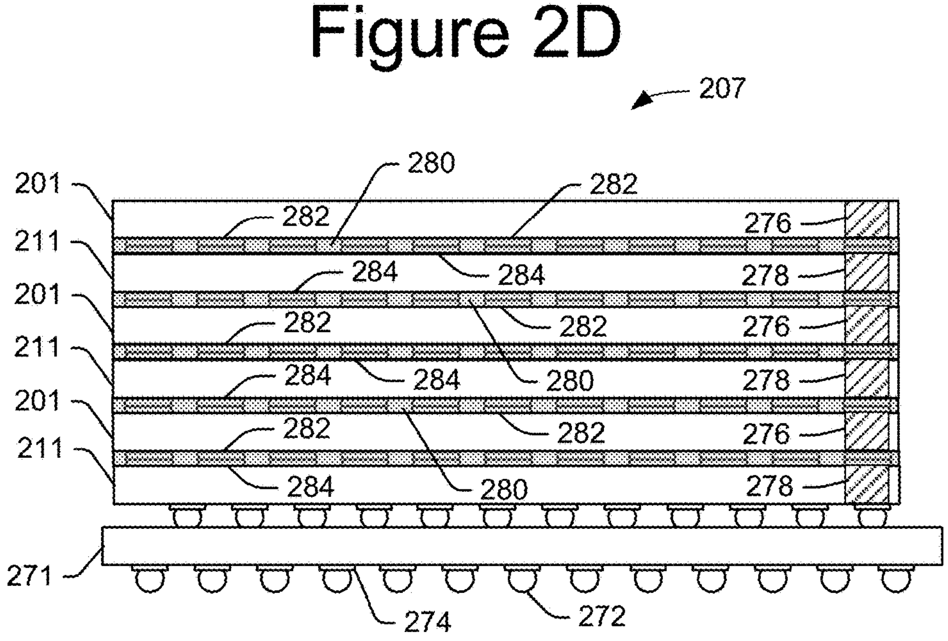

FIG. 2D depicts a side view of another embodiment of an integrated memory assembly 207 stacked on a substrate 271. The integrated memory assembly 207 of FIG. 2D has three control die 211 and three memory structure die 201. In some embodiments, there are many more than three memory structure die 201 and many more than three control die 211. In this example, each control die 211 is bonded to at least one memory structure die 201. Optionally, a control die 211 may be bonded to two or more memory structure die 201.

Some of the bond pads 282, 284 are depicted. There may be many more bond pads. A space between two die 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the die 201, 211. Where no such film is initially provided, a space between the die may be under filled with an epoxy or other resin or polymer. The under-fill material may be applied as a liquid which then hardens into a solid layer. This under-fill step protects the electrical connections between the die 201, 211, and further secures the die together. Various materials may be used as under-fill material, but in embodiments, it may be Hysol epoxy resin from Henkel Corp., having offices in California, USA.

Figure 3:
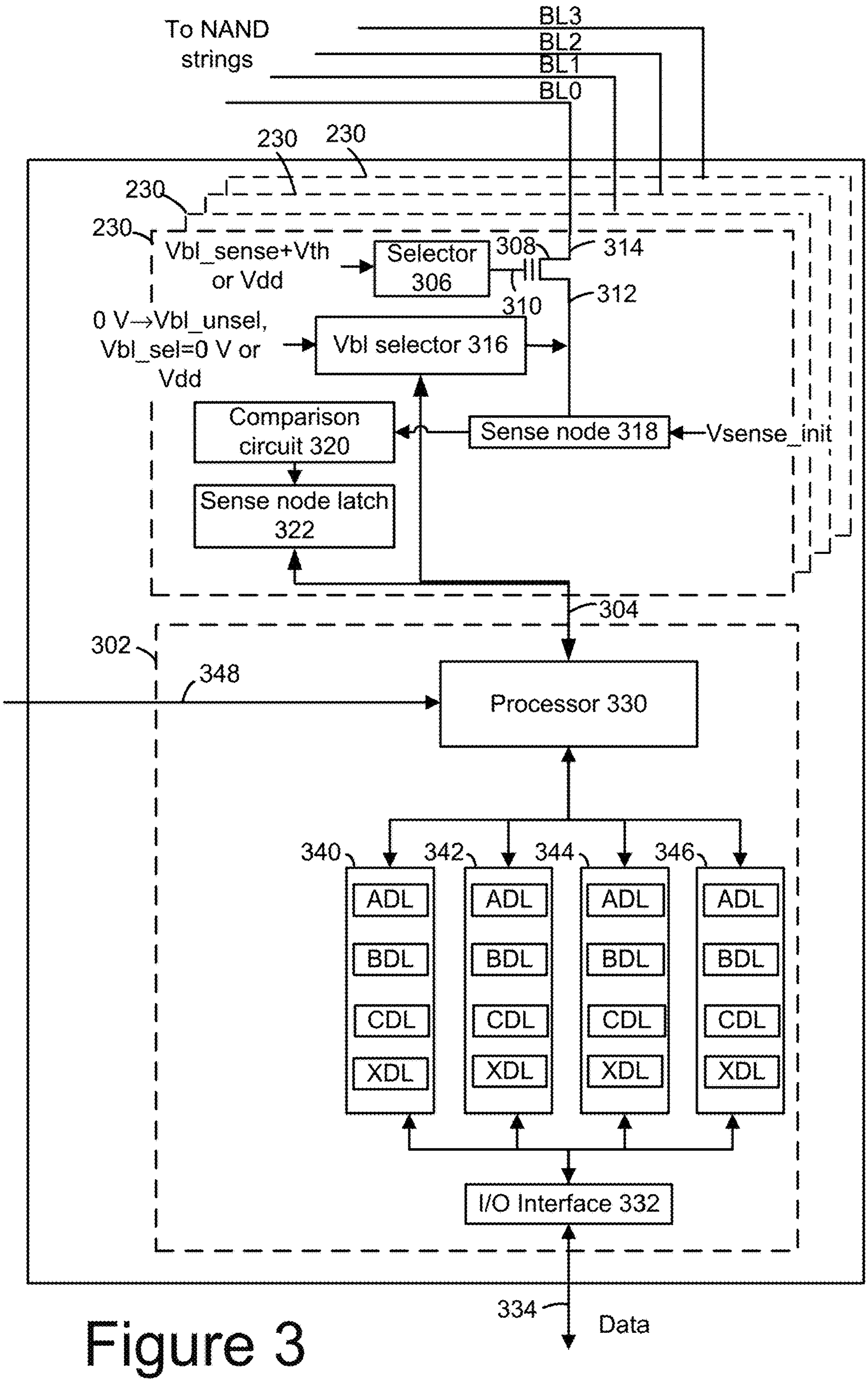
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg−Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg−Vcelsrc−Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage.

If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or a program enable level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or fewer than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two agree, processor 330 sets the bit line in a program inhibit mode such as by updating its latches. This inhibits the memory cell coupled to the bit line from further programming even if additional program pulses are applied to its control gate.

Figure 4A:
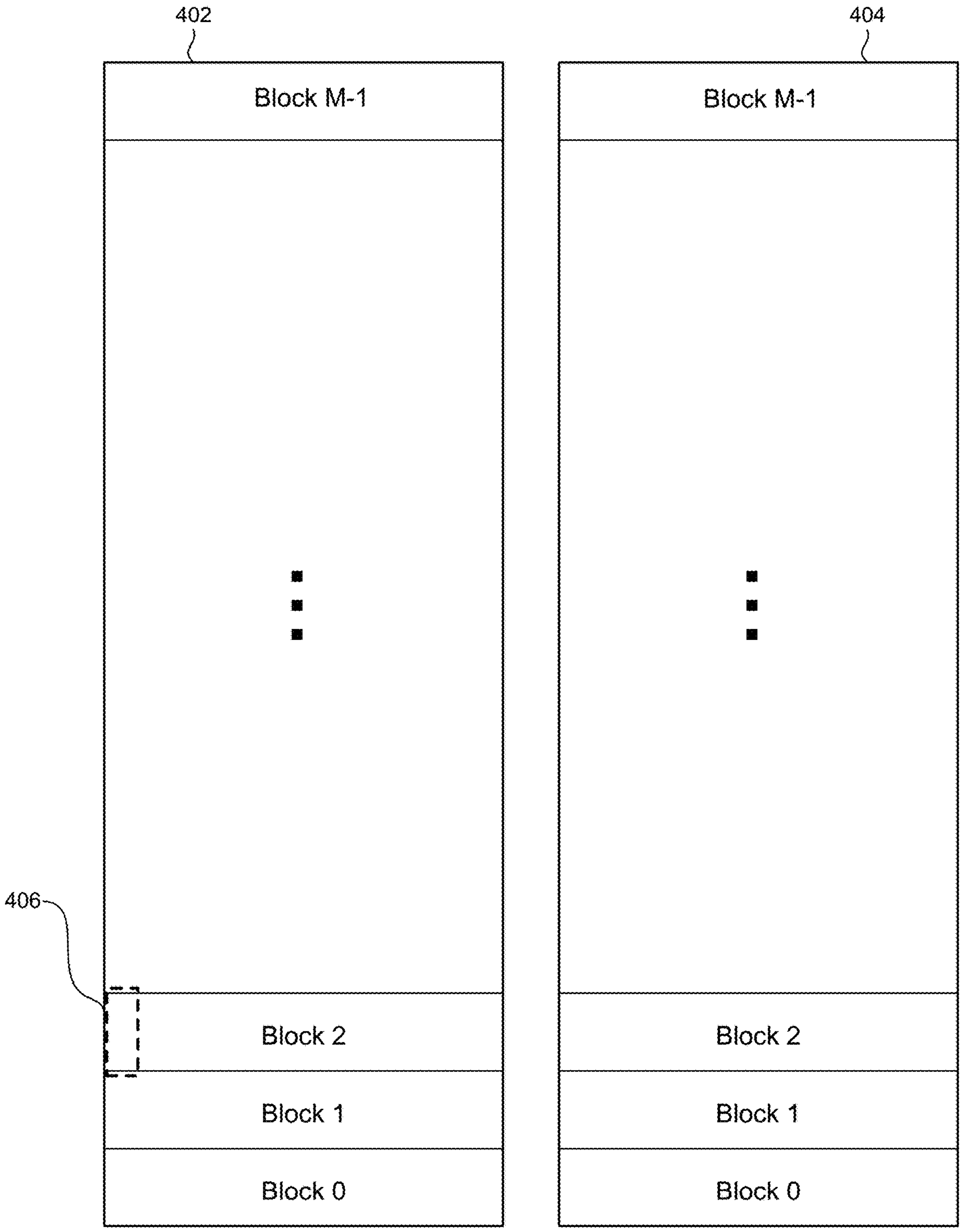
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or fewer than two planes can be implemented. In some embodiments, memory structure 202 includes four planes. In some embodiments, memory structure 202 includes eight planes. In some embodiments, programming can be performed in parallel in a first selected block in plane 402 and a second selected block in plane 404.

Figure 4B:
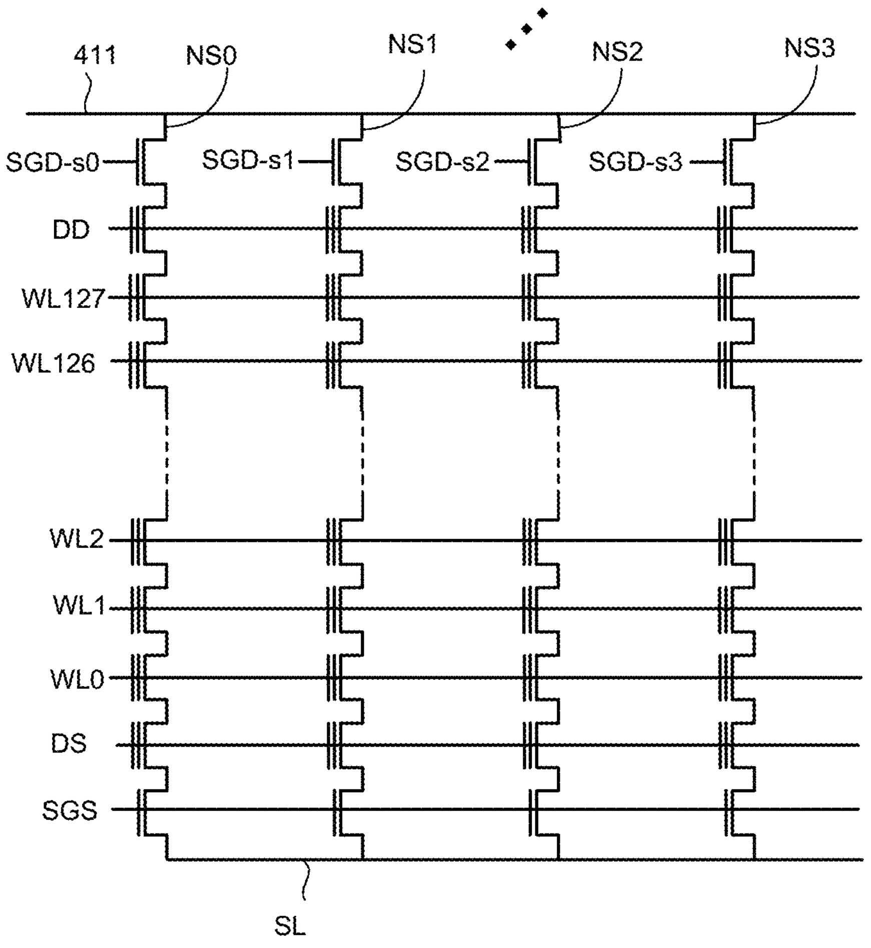
FIG. 4B is a schematic of a plurality of NAND strings in multiple sub-blocks of a same block.

FIG. 4B is a schematic diagram of a portion of the memory structure 202. FIG. 4B shows physical data word lines WL0-WL127 running across the entire block. There is also a source side dummy word line (DS) and a drain side dummy word line (DD), which do not store user data. Also depicted is a source side selected line (SGS) and a several drain side selected lines (SGD-s0, SGD-s1, SGD-s2, SGD-s3). The structure of FIG. 4B corresponds to a portion 406 in Block 2 of FIG. 4A, including bit line 411. Within the block, in one embodiment, each bit line is connected to four NAND strings. Thus, FIG. 4B shows bit line connected to NAND string NS0, NAND string NS1, NAND string NS2, and NAND string NS3.

In one embodiment, there are four drain side select lines in the block (SGD-s0, SGD-s1, SGD-s2, and SGD-s3). Each respective drain side select line can be selected independent of the others. Each drain side select line connects to a group of NAND strings in the block. Only one NAND string of each group is depicted in FIG. 4B. These four drain side select lines correspond to four sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. As noted, FIG. 4B only shows the NAND strings connected to bit line 411. However, a full schematic of the block would show every bit line and four vertical NAND strings connected to each bit line.

In some embodiments, the block is divided into an upper tier and a lower tier, each of which contains half the word lines. For example, the lower tier may contain WL0-WL63 and the upper tier may contain WL64-WL127. In some embodiments, the upper tier and lower tier may be erased independently. In some embodiments, parity data is computed independently for the upper and lower tiers. In some embodiments, parity data for the lower tier is stored in the lower tier and parity data for the upper tier is stored in the upper tier.

Although the example memories of FIGS. 4A-4B are three dimensional memory structure that includes vertical NAND strings, other (2D and 3D) memory structures can also be used with the technology described herein.

Figure 5A:
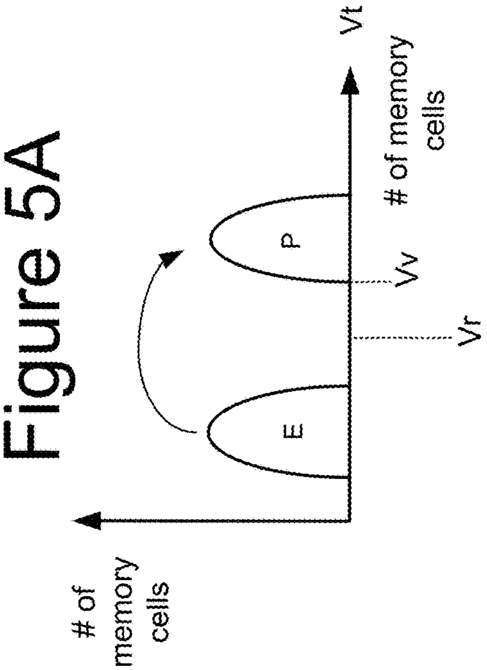
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
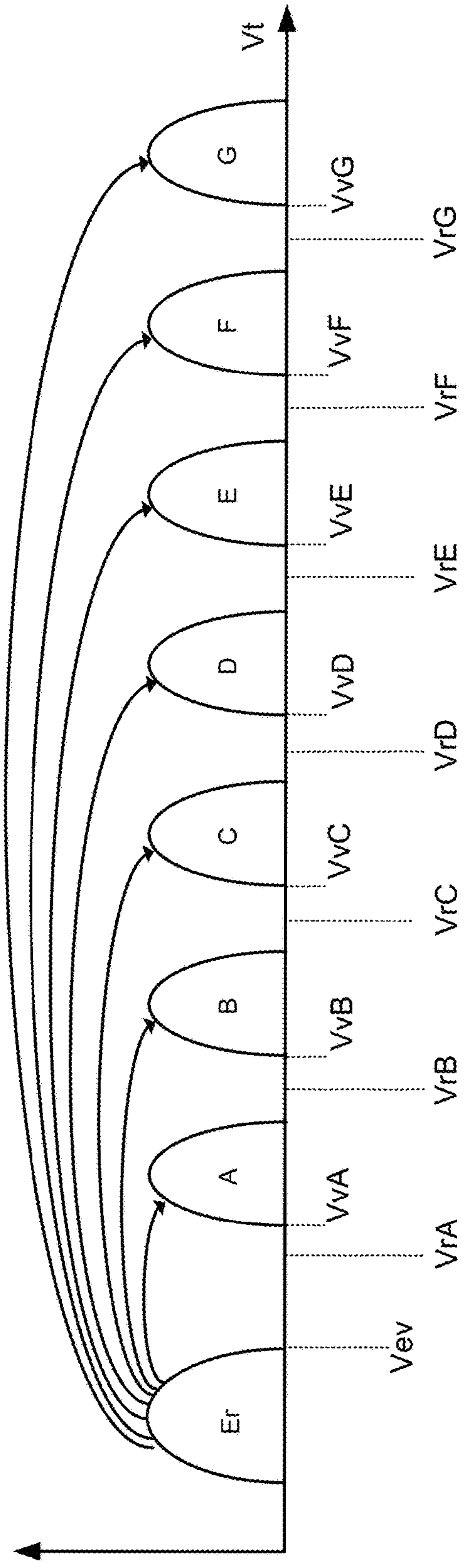

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

In some embodiments, a post-program read test is performed just after the data is programmed. As noted, the program operation will verify the memory cells by testing their respective Vts with respect to the target verify voltage. It is possible that a memory cell could be overprogrammed and still pass the program verify. For example, a memory cell that is being programmed to the A-state could be overprogrammed such that its Vt is above the read level for the B-state (VrB). In this case, a post-program read test will read the memory cell as being in the B-state instead of the intended A-state. The post-program read test will attempt to decode an ECC codeword that was programmed in a group of memory cells. If too many memory cells have been overprogrammed, then the post-program read test will fail. Other factors, such as under-programming of memory cells can also contribute to failure of the post-program read test.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5B represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

Figure 6:
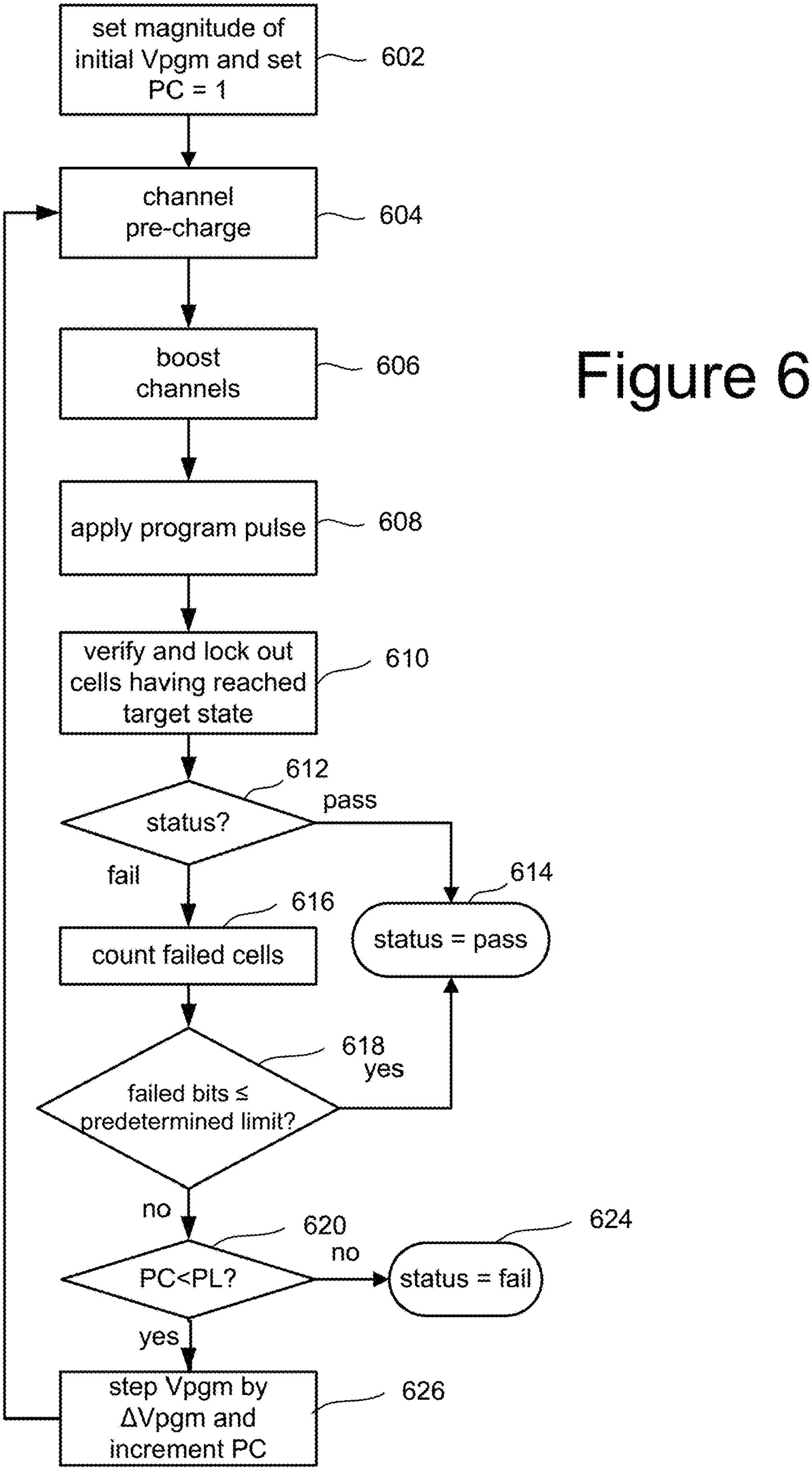
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. The process may be used to program user data, as well as parity data for that user data. When programming user data or parity data, one or more ECC codewords may be programmed into a unit of memory cells. In an embodiment, the process is used to program a unit of memory cells that is referred to herein as a page of memory cells. In an embodiment, if each memory cell stores one bit then one page is stored in the page of memory cells. In an embodiment, if each memory cell stores two bits then two pages are stored in the page of memory cells. In an embodiment, if each memory cell stores three bits then three pages are stored in the page of memory cells. In an embodiment, if each memory cell stores four bits then four pages are stored in the page of memory cells. In an embodiment, each page of data includes one or more ECC codewords.

In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 may also include determining whether a memory cell should receive slow programming during the next program loop, as opposed to full programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify high voltage. If a memory cell has a Vt between the verify low voltage and the verify high voltage, then the memory cell may be marked for slow programing the next program loop. In one embodiment, one or more data latches in the managing circuit 302 are used to indicate whether a memory cell is locked out, is to receive slow programming, or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B.

Figure 7A:
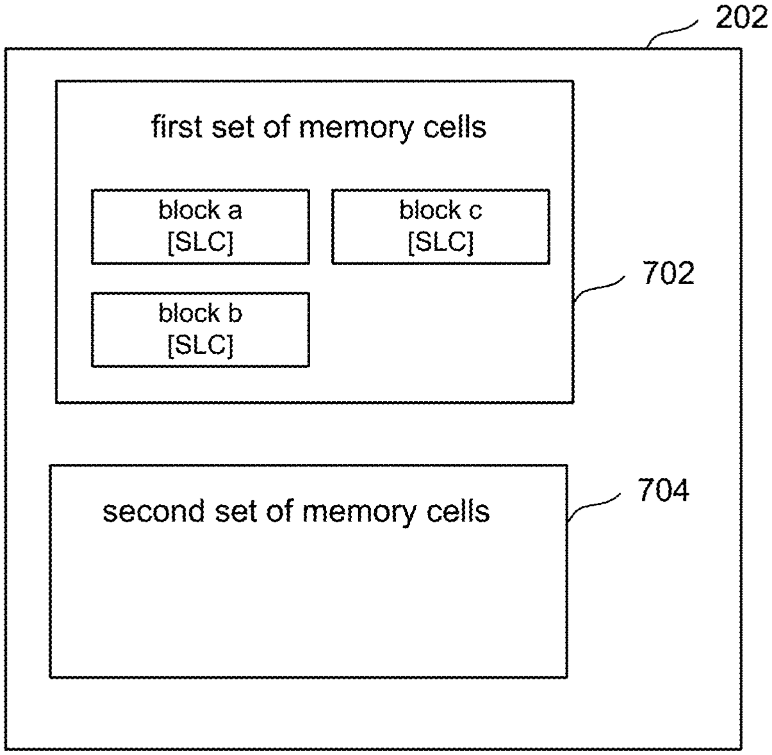
FIG. 7A depicts a portion of memory structure before a folding operation.
Figure 7B:
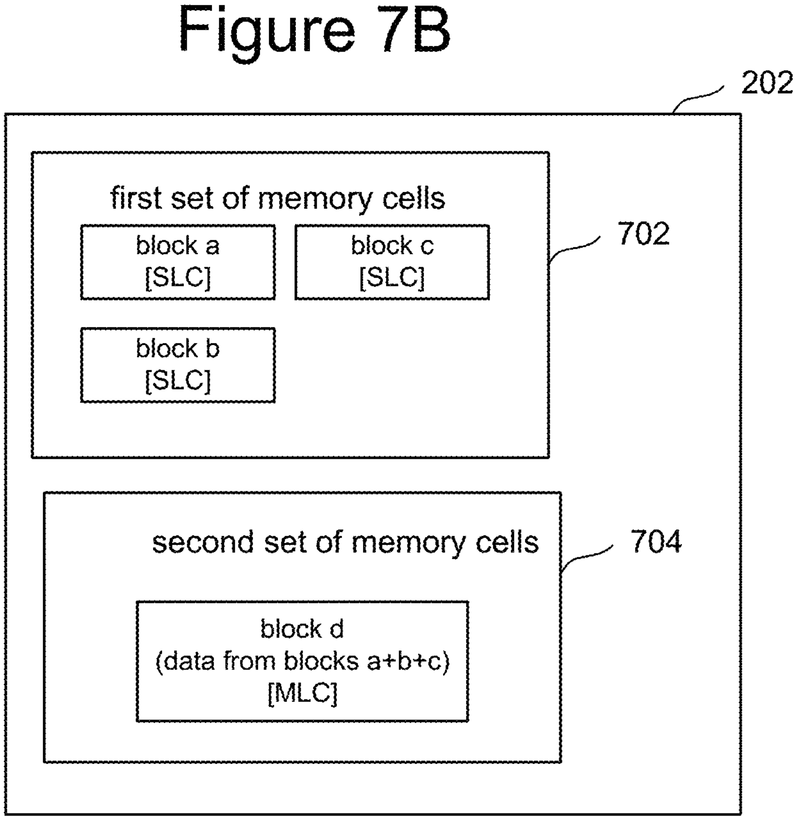
FIG. 7B depicts the portion of memory structure immediately after the folding operation.

In some embodiments, data is folded from SLC cells to MLC cells. FIG. 7A depicts a portion of memory structure 202 before folding operation and FIG. 7B depicts the portion of memory structure 202 immediately after the folding operation for one embodiment of the folding from SLC cells to MLC cells. FIGS. 7A and 7B show memory structure 202 including a first set of non-volatile memory cells 702 and a second set of non-volatile memory cells 704. In the embodiment of FIGS. 7A/7B, prior to performing the folding operation, the first set of non-volatile memory cells 702 store data in three blocks (block a, block b and block c) as single bit per memory cell (SLC) data. In one set of embodiments, each of blocks a, b and c store multiple codewords; for example, each word line of each block (or each page of each block) can store one or multiple codewords.

FIG. 7B depicts the portion of memory structure 202 immediately after the folding operation. At this time, the SLC data is still stored in the first set of memory cells 702. In some embodiments, the SLC data is accessed in the event that a post-program read test following the folding operation fails. Thus, the SLC data is accessible for such purposes. During an embodiment, memory controller 120 causes the data in block a, block b and block c to be programmed into block d at three bits per memory cell. In one embodiment, the data from block a, block b and block c are transferred to the memory controller 120. The memory controller 120 may use the ECC engine 158 to error correct the SLC data prior to programming the data into block d as MLC data. Thus, each memory cell of block d stores three bits of data: one bit that originated from block a, one bit that originated from block b and one bit that originated from block c. Thus, the programming of the codewords as multiple bits per memory cell data can be performed such that the second set of memory cells 704 store data from multiple codewords (e.g., a code word from block a, a codeword from block b and a codeword from block c).

Note that although FIG. 7B shows the SLC data in the first set of non-volatile memory cells 702, at some later point in time the SLC blocks can be used for storing other data. In some embodiments, the SLC blocks are erased after the folding operation is completed and the SLC data is no longer needed. In some embodiments, the SLC blocks are marked as having invalid data, although the SLC cells need not be erased until a later time.

FIG. 8 is a table that shows locations in non-volatile memory for user data and parity data for one embodiment of managing parity data. The table illustrates one possible way to form parity data from user data at specific locations in the non-volatile memory. The example is for two memory die. Each memory die has two planes in this example. Recall from FIG. 4A that each plane has many blocks. Recall from the discussion of FIG. 4B that a block may be divided into an upper tier and a lower tier. In one embodiment, each block is divided into an upper tier and a lower tier, wherein there may be 64 word lines in each tier. Hence, FIG. 8 may represent programming into the lower tier of four different blocks, as well as storing the parity data in the lower tier.

Only word lines 0, 1, 2, 62, and 63 are represented in FIG. 8. Consistent with the example in FIG. 4B, there are four sub-blocks in each block. Units of data (either user data or parity data) may be programmed in what is referred to herein as a page. In one embodiment, the memory cells in a plane that are programmed together are referred to herein as a physical page of memory cells. This page of memory cells may store SLC data or MLC data. For example, three pages of user data may be programmed into a physical page of memory cells by programming one bit of each page into each memory cell. Therefore, each memory cell will store three bits. In a NAND embodiment, each physical page of memory cells resides in the same block. Also, in a NAND embodiment, each physical page of memory cells is connected to the same word line. In one embodiment, a page of user data is 16 KB. However, a page could be larger or smaller. Also, the ECC engine 158 may form one or more ECC codewords for each page of user data. The one or more ECC codewords that are stored may be larger than the page of user data (for example, larger than 16 KB). The example depicted in FIG. 8 may be used for SLC programming or MLC programming.

The column labeled "LWL" refers to logical word line. In FIG. 8, there are 256 logical word lines. The logical word lines are defined based on a combination of word line and sub-block. For example, LWL 0 corresponds to WL0 and sub-block 0, LWL 1 corresponds WL0 and sub-block 1, etc. A LWL may span multiple planes. For example, LWL 0 may span Plane 0 and Plane 1 on both Memory Die 0 and Memory Die 1. In some embodiments, programming is performed one LWL at a time, with programming occurring in parallel on the four planes. For example, the process of FIG. 6 may be performed separately but simultaneously on the four planes. As noted, this programming could be SLC data or MLC data.

The user data is programmed into the user groups 802 of memory cells that are connected to WL0-WL61, in this example. An example will be described in which each user group of memory cells corresponds to a LWL for one plane. For example, one user group 802 includes the memory cells in plane 0 connected to WL0 and sub-block 0, another user group 802 includes the memory cells in plane 0 connected to WL0 and sub-block 1, etc. In an embodiment, each of these user groups 802 is referred to as a page of memory cells. A page of memory cells may store one or more ECC codewords. The parity data is programmed into the parity groups 804 of memory cells that are connected to WL62 and WL63, in this example.

Parity data is formed from the user data stored in a specific set of user groups 802 of memory cells. In one embodiment, the parity data is a successive bitwise XOR of the user data in each respective user group 802 in the set. The term "parity group" may be used herein to refer to the set of user groups 802 upon which the parity data is calculated. The numerals in the column labeled "plane x" refer to different parity groups. Plane 0 of memory die 0 will be used to illustrate. The numerals 0-7 in WL0-WL2 represent eight different parity groups. The pattern depicted in WL0-WL2 repeats for WL3-WL61. The parity data for parity group 0 is stored in WL62, sub-block 0 (for plane 0 of memory die 0), the parity data for parity group 1 is stored in WL62, sub-block 1 (for plane 0 of memory die 0), etc. The parity data for Plane 0 of Memory Die 1 is managed similarly. Plane 1 has parity groups 8-15 (these are separate and distinct for memory die 0 and 1). The parity data for parity group 12 of die is stored in WL62, sub-block 0 (for plane 1 of memory die 0), the parity data for parity group 13 is stored in WL62, sub-block 1 (for plane 1 of memory die 0), etc. In this example, the parity data for each plane is computed based only on data stored in that plane. However, in other schemes, the parity data is computed based on user data stored on two or more planes. Those two or more planes could be on the same memory die or on different memory die. Thus, it will be understood that many different schemes may be used for forming parity groups. Further details of schemes for forming parity groups are described in U.S. Pat. No. 10,872,012 to Subramanian et al., titled "XOR Recovery Schemes Utilizing External Memory," which is hereby incorporated by reference.

It is possible that even if the programming process completes successfully that a post-program read test can fail for one or more of the user groups 802. FIG. 8 highlights a user group 802*a* for which the post-program read test failed. This means that although programming completed successfully (including the verify), when the data in user group 802*a* was read back there was a problem decoding the data. A possible reason for this failure is that too many memory cells were over-programmed. In one embodiment, the post-program read test fails if an ECC codeword cannot be decoded by an ECC algorithm. In one embodiment, the parity data is recalculated such that it is no longer based on the data that was stored in the user group 802 that failed the post-program read test. In the present example, the parity data for parity group 3 for memory die 0 is no longer based on the data stored in memory cells on WL2, sub-block 3. However, the parity data continues to be based on the rest of the user groups 802 in parity group 3 (for memory die 0). Therefore, if at a later time the user data in one of these other user groups 802 cannot be decoded, data recovery does not depend on the user data in user group 802*a*. This technique can be especially useful in storage systems which are unusually susceptible to errors in the stored data, such that decoding an ECC codeword immediately after programming has a relatively high chance of failure. Note that a relatively high chance of failure will still be quite low, but is relatively high compared to another storage system.

In some embodiments, the system calculates parity data as it folds SLC data to MLC data. FIG. 9 is a table that represents how SLC data can be folded into MLC data. The table shows how SLC data from three blocks of SLC cells can be folded into MLC data for one block of MLC cells. In this example, the block of MLC cells is on Plane 0 of Memory Die 0. With reference back to FIG. 8, this is one of the four planes in FIG. 8. Referring again to FIG. 9, the three SLC blocks are referred to as SLC B0, SLC B1, and SLC B2. The MLC data is programmed at three bits per cell programmed as a lower page (LP), a middle page (MP) and an upper page (UP). The data in SLC B0 will be used for the lower page. The data in SLC B1 will be used for the middle page. The data in SLC B2 will be used for the upper page. The data at a given LWL in an SLC block may be programmed to the same LWL in the MLC block. For example, the data at SLC B0, LWL 0 may be programmed as the lower page at LWL 0 in the MLC block, the data at SLC B1, LWL 0 may be programmed as the middle page at LWL 0 in the MLC block, etc.

The same scheme for parity groups that was discussed in FIG. 8 may be used in the example of FIG. 9. Thus, there may be eight parity groups (0-7) for Plane 0 of Memory Die 0. The parity groups 804 may be memory cells at WL62 and WL63, as in the example of FIG. 8. Each memory cell in the parity groups 804 stores three bits in this example. For example, the memory cells at LWL 248 (or WL62, sub-block 0) each store one bit for the lower page, one bit for the middle page, and one bit for the upper page. The lower page of parity data is based on the lower page of user data stored in the user groups for parity group 0. The middle page of parity data is based on the middle page of user data stored in the user groups for parity group 0. The upper page of parity data is based on the upper page of user data stored in the user groups for parity group 0.

As noted above, it is possible for a post-program read test to fail. Consistent with the example in FIG. 8, an example is depicted in which user group 802*a* failed the post-program read test. The post-program read test could attempt to read a single page in one read operation, or to read all the pages in the same read operation. In an embodiment, if decoding of any of the pages in user group 802*a* fails, then the post-program read test is a failure for the user group 802*a*. The parity data for parity group 0 is re-calculated such that it is no longer based on the user data in user group 802*a*. The data that was stored in user group 802*a* may be stored elsewhere in the memory structure.

Figure 10:
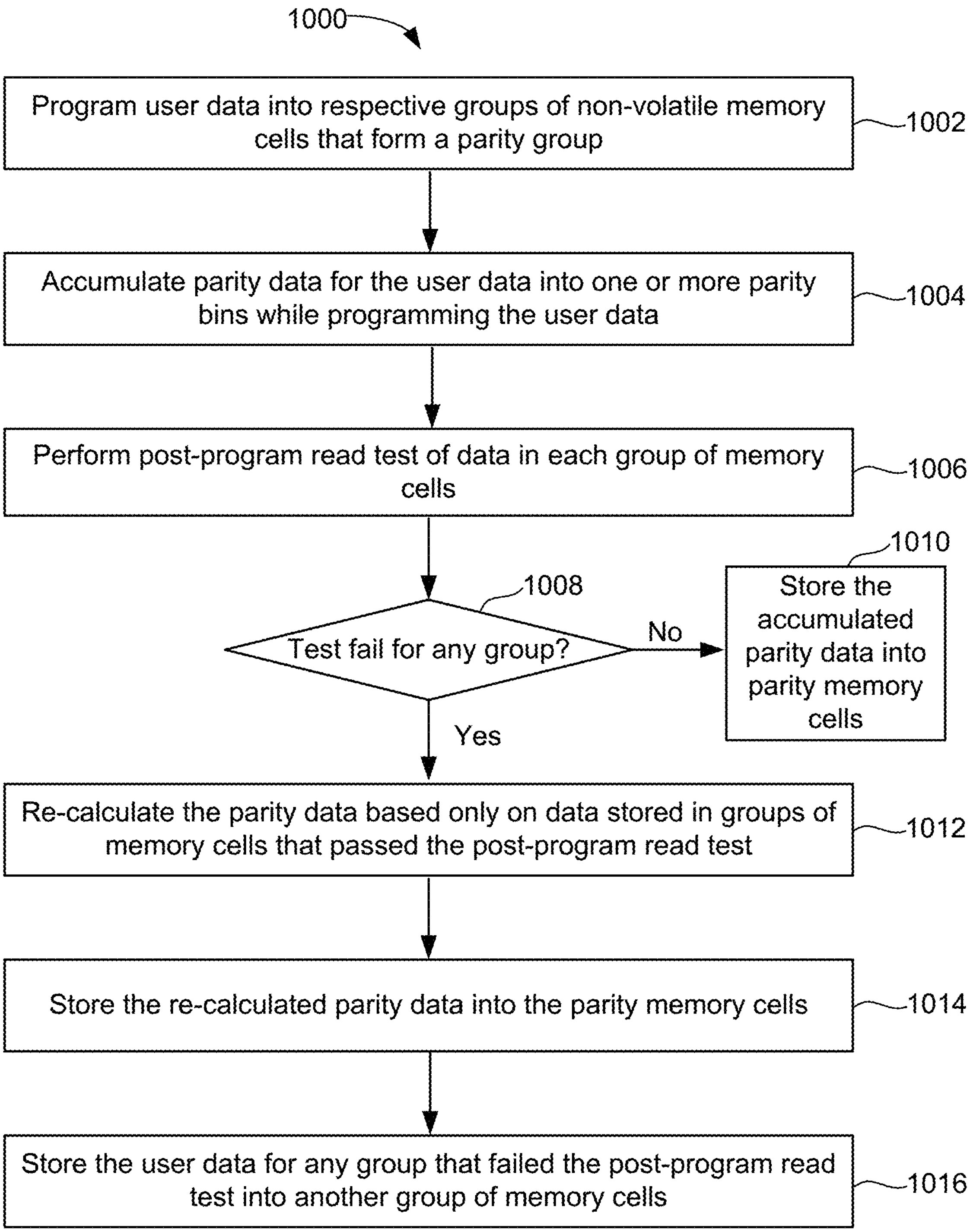
FIG. 10 is a flowchart depicting one embodiment of a process of calculating parity data.

FIG. 10 is a flowchart depicting one embodiment of a process 1000 of calculating parity data. Process 1000 may be performed by one or more control circuits as defined above. In one embodiment, the memory controller 120 controls the overall flow of the process. However, some of the steps (or actions within a step) may execute under control of the state machine 262 or other circuitry. The steps may be performed in a different order than depicted in FIG. 10.

Step 1002 includes programming data into respective groups of memory cells that form a parity group. Examples of parity groups were discussed in connection with FIGS. 8 and 9. For example, with respect to FIG. 8, the parity group could be memory cells in Plane 0 of Memory Die 0 in parity group 0. In an embodiment, the system programs one page of memory cells in the parity group at a time. However, the system can program different pages in different parity groups in parallel. For example, the system could program the four pages of cells for LWL 0 in FIG. 8 in parallel. Note that the discussion of process 1000 will focus on programming of one of these parity groups. In an embodiment, one or more ECC codewords are programmed into the page of memory cells. Step 1002 can program SLC data or MLC data. In one embodiment, process 1000 is used when folding SLC data to MLC data.

Step 1004 includes accumulating parity data for the user data into one or more parity bins while programming the user data. In an embodiment, the parity bin(s) is/are located in local memory 140. In one embodiment, the parity data is formed based on successive bitwise XORs of the user data. In one embodiment, one page of parity data is accumulated for SLC programming, but multiple pages of parity data are accumulated for MLC programming. In one embodiment, each page of parity data is accumulated into a different parity bin in local memory 140. Further details of one embodiment of accumulating parity data are discussed below in the description of FIG. 11. Note that step 1004 is performed as the user data is being programmed.

Step 1006 includes performing a post-program read test of user data that was programmed into each group of memory cells in the parity group. In one embodiment, step 1006 is performed after all groups in the parity group have been programmed. However, step 1006 could be performed for a particular group at any time after that group has been programmed. Embodiments of the post-program read test differ from the program verify test in one or more ways. One difference is the reference levels. The program verify checks for whether the Vt of a memory cell has reached a target verity Vt (e.g., VvA, VvB, etc.), whereas the post-program read test reads at read reference levels (e.g., VrA, VrB, etc.). A second difference is that the program verify does not attempt to decode the data, whereas the post-program read test does attempt to decode the data. Also, the program verify test does not attempt to determine what state a memory cell is in, but only whether the Vt is at least as high as the target verify level for the respective memory cell. Hence, the program verify test could pass even if the memory cell is over-programmed. Further details of one embodiment of a post-program read test are discussed below in the description of FIG. 12.

Step 1008 is a determination of whether the post-program read test failed for any group of memory cells in the parity group. If all groups passed the post-program read test, then in step 1010 the accumulated parity is stored into a group (e.g., page) of parity memory cells. For example, the parity data may be stored in the memory cells at WL62, sub-block 0 (on Memory Die 0, Plane 0) for the example of parity group 0 on Memory Die 0, Plane 0. In an embodiment, the parity data is stored as one or more ECC codewords.

If at least one group failed the post-program read test, then steps 1012-1016 are performed. Step 1012 incudes re-calculating the parity data based only on the data stored in groups (e.g., pages) of memory cells that passed the post-program read test. In one embodiments, step 1012 includes re-calculating the parity data such that the parity data is no longer based on the user data stored in the group that failed the post-program read test. In one embodiment, step 1012 includes performing a bitwise XOR of the accumulated parity data (after programming all groups) and the user data that was programmed into the group that failed the post-program read test. Further details of one embodiment of re-calculating the parity data are discussed below in the description of FIG. 13.

Step 1014 includes storing the re-calculated parity data into the parity group 804 of memory cells. The same group of memory cells that would have been used if step 1010 had been performed may be used to store the re-calculated parity data. The re-calculated parity data may be stored as one or more ECC codewords.

Step 1016 includes storing the user data for any group that failed the post-program read test into another group of memory cells. This other group of memory cells could be in a different block of memory cells.

Figure 11:
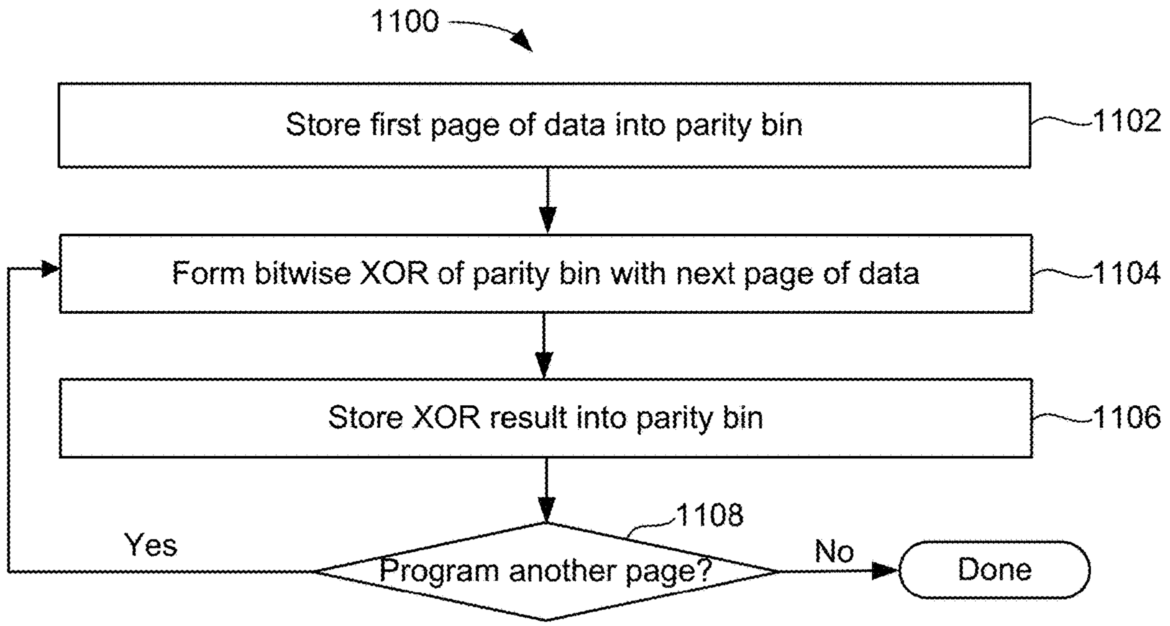
FIG. 11 is a flowchart of an embodiment of a process of accumulating parity data.

FIG. 11 is a flowchart of an embodiment of a process 1100 of accumulating parity data. The process 1100 is one embodiment of step 1004 in process 1000. Process 1100 describes the programming of a number of pages of user data. These are pages that are programmed into the parity group. Process 1100 may be used for SLC data or for MLC data. For MLC data the process may be performed separately for each page stored into each group of memory cells. With reference to FIG. 9, process 1100 may be performed separately for the lower page, middle page, and upper page.

Step 1102 includes storing a first page of user data into a parity bin in, for example, local memory 140. This is the first page that will be programmed into the parity group. However, the user data that is stored in the parity bin need not be the full ECC codeword(s) that are stored in the non-volatile memory cells.

Step 1104 includes forming a bitwise XOR between the present content of the parity bin and the next page of user data. Hence, step 1104 results in a bitwise XOR of the first two pages of user data. Step 1106 includes storing the XOR result of step 1104 into the parity bin.

Step 1108 is a determination of whether there is another page of user data to program. If so, in step 1104 a bitwise XOR between the present content of the parity bin and the next page of user data is formed. Then, in step 1106, the content of the parity bin are updated to store the most result bitwise XOR of step 1104.

The process continues until all pages of user data for this parity group have been programmed. At this point, the parity bin will have a final accumulation of the parity data. Thus, the XOR parity will be based on all of the pages of user data for this parity group. When the XOR parity from the parity bin is programmed to the non-volatile memory cells, the memory controller 120 may form one or more ECC codewords from the XOR parity.

Figure 12:
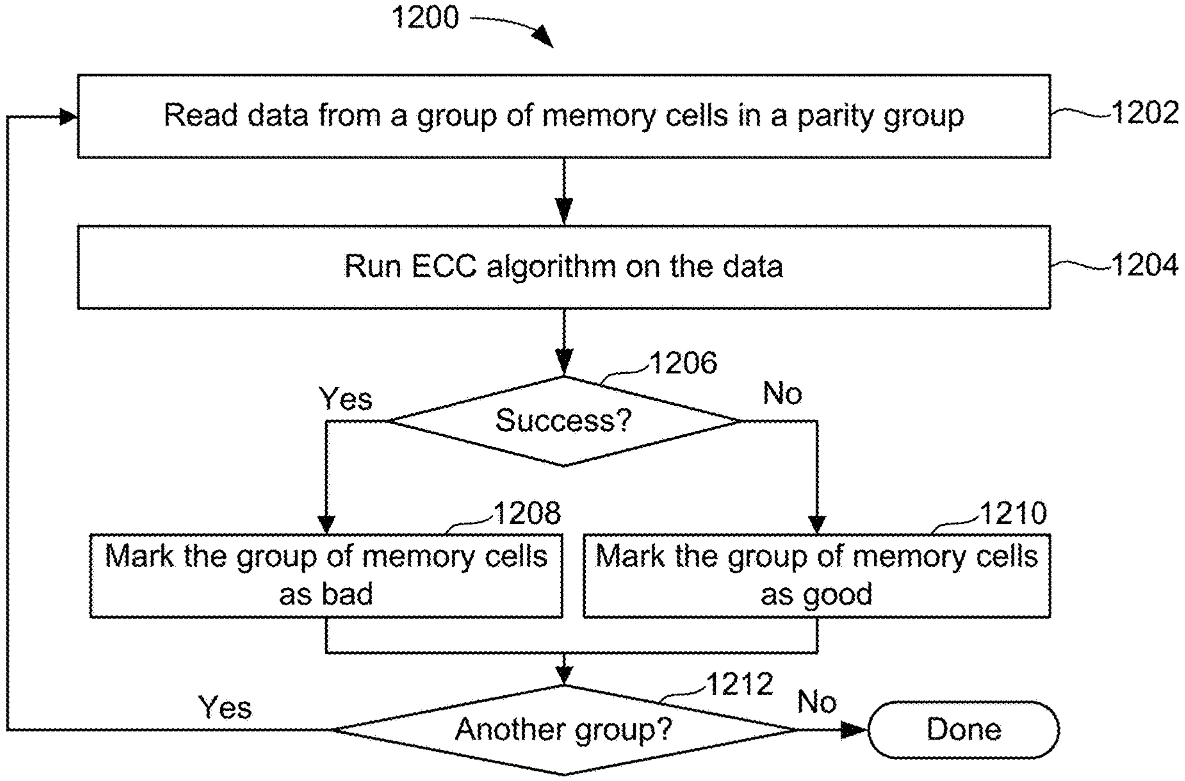
FIG. 12 is a flowchart of one embodiment of a process performing a post-program read test.

FIG. 12 is a flowchart of one embodiment of a process 1200 performing a post-program read test. Process 1200 is one embodiment of step 1006 of process 1000. Step 1202 includes reading data from a group of memory cells in a parity group. In one embodiment, the memory cells are MLC cells and the memory cells are read at a number of read reference levels. In one embodiment, the system control logic 260 controls the row control circuitry 220 and the column control circuitry 210 to read the memory cells at a number of read reference levels. In an embodiment, the system control logic 260 forms a page of raw (undecoded) data for each page of data stored in the group. For example, the system control logic 260 may form a raw lower page, a raw middle page, and a raw upper page of data. In an embodiment, the system control logic 260 sends these pages of raw data to the memory controller 120, such that an ECC engine 158 on the memory controller 120 can decode the data. However, in one embodiment, the system control logic 260 has an ECC engine, such that the raw data need not be sent to the memory controller 120.

Step 1204 includes running an ECC algorithm on the data. For example, ECC decoder 158 is used to attempt to decode one or more ECC codewords in the data that was read. In one embodiment, a bit error rate (BER) is determined. The BER may be determined for each ECC codeword. The BER may be determined by ECC engine 158. In another embodiment, instead of determining a BER, the ECC engine 158 simply determines whether the data is decodable (versus decoding failing). The option of determining the BER allows for a failure of the post-program read test even if the data is decodable. If multiple pages are stored in this group of memory cells, step 1204 separately decodes each page.

Step 1206 is a determination of whether decoding was successful. If multiple ECC codewords are stored in this group of memory cells, the post-program read test fails if any of the ECC codewords are undecodable. In one embodiment, success or failure of the post-program read test depends on the BER. If the BER for any of the ECC codewords is above a threshold, then the test fails. Note that this threshold is at or below a decodable level. Thus, the data needs to be decodable for the post-program read test to pass the BER condition.

If the post-program read test failed, then in step 1208 this group of memory cells are marked as bad. If the post-program read test passed, then in step 1210 this group of memory cells are marked as good. Note that a good marking can be the default such that only if the group fails the post-program read test will there be a need to record this information. In an embodiment, the memory controller 120 manages a table or the like to track which groups are good or bad. A permanent version of the table may be stored in the memory structure 202. A temporary copy may be stored in local memory 140.

In step 1212 a determination is made whether there is another group of memory cells to evaluate. If so, then the process returns to step 1202 to read data from the next group of memory cells. After all group of memory cells have been tested, the process 1200 concludes.

Figure 13:
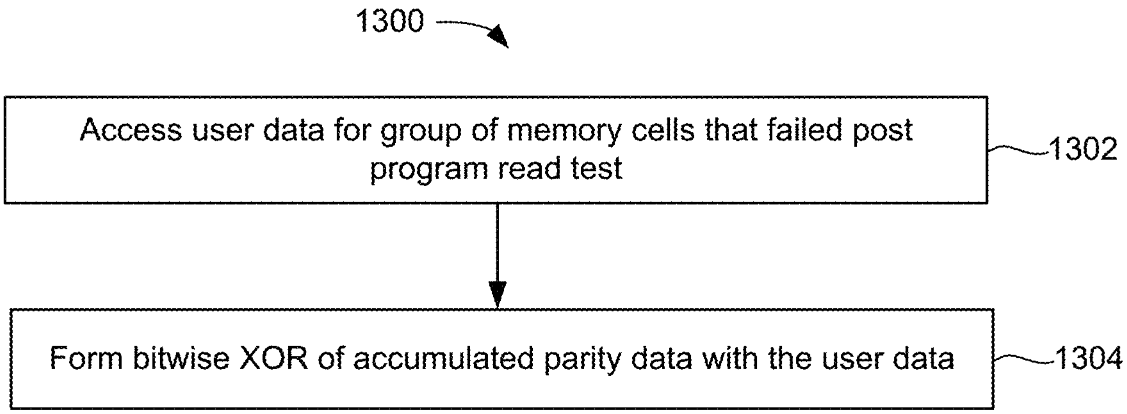
FIG. 13 is a flowchart of one embodiment of a process of re-calculating parity data.

FIG. 13 is a flowchart of one embodiment of a process 1300 of re-calculating parity data. Process 1300 is one embodiment of step 1012 of process 1000. Step 1302 includes accessing a user data for a group of memory cells that failed the post-program read test. In one embodiment, this user data is accessed from SLC memory cells. Recall that the managing of the parity data may occur during a process of folding SLC data to MLC data. Hence, the SLC data will still be in the SLC memory cells immediately after the post-program read test. In one embodiment, a page of SLC data is accessed from each of multiple blocks of SLC cells.

Step 1304 includes performing a bitwise XOR between the accumulated parity data and the user data. FIG. 9 will be used as an example. In FIG. 9, the user data for LWL 11 (WL2, sub-block 3) fails the post-program read test. That user data is part of parity group 3 (see FIG. 8). That user data can be accessed from LWL 11 (i.e., WL2, sub-block 3) of SLC B0, SLC B1, and SLC B2.

The accumulated XOR parity for parity group 3 is not yet stored in the memory cells. Rather, the accumulated XOR parity for parity group 3 is still in parity bins in, for example, local memory 140. In one embodiment, there is a separate parity bin for each page (e.g., LP, MP, UP). Thus, step 1304 may include performing a bitwise XOR between the parity bin for the lower page and the user data at LWL 11 of SLC B0. Likewise, a bitwise XOR between the parity bin for the middle page and the user data at LWL 11 of SLC B1 may be performed. Also, a bitwise XOR between the parity bin for the upper page and the user data at LWL 11 of SLC B2 may be performed. Collectively, these bitwise XORs will perform a bitwise XOR between the accumulated parity data and the user data. Recall that in step 1016 of process 1000 that the re-calculated parity data is stored to the memory cells. With reference to FIG. 9, the re-calculated parity data may be programmed to LWL 251 (i.e., WL 62, sub-block 3) on Plane 0 of Memory Die 0. In the example in FIG. 9, there is a lower page, middle page, and upper page of parity data. In general, there may be more or fewer than three pages of parity data.

Figure 14:
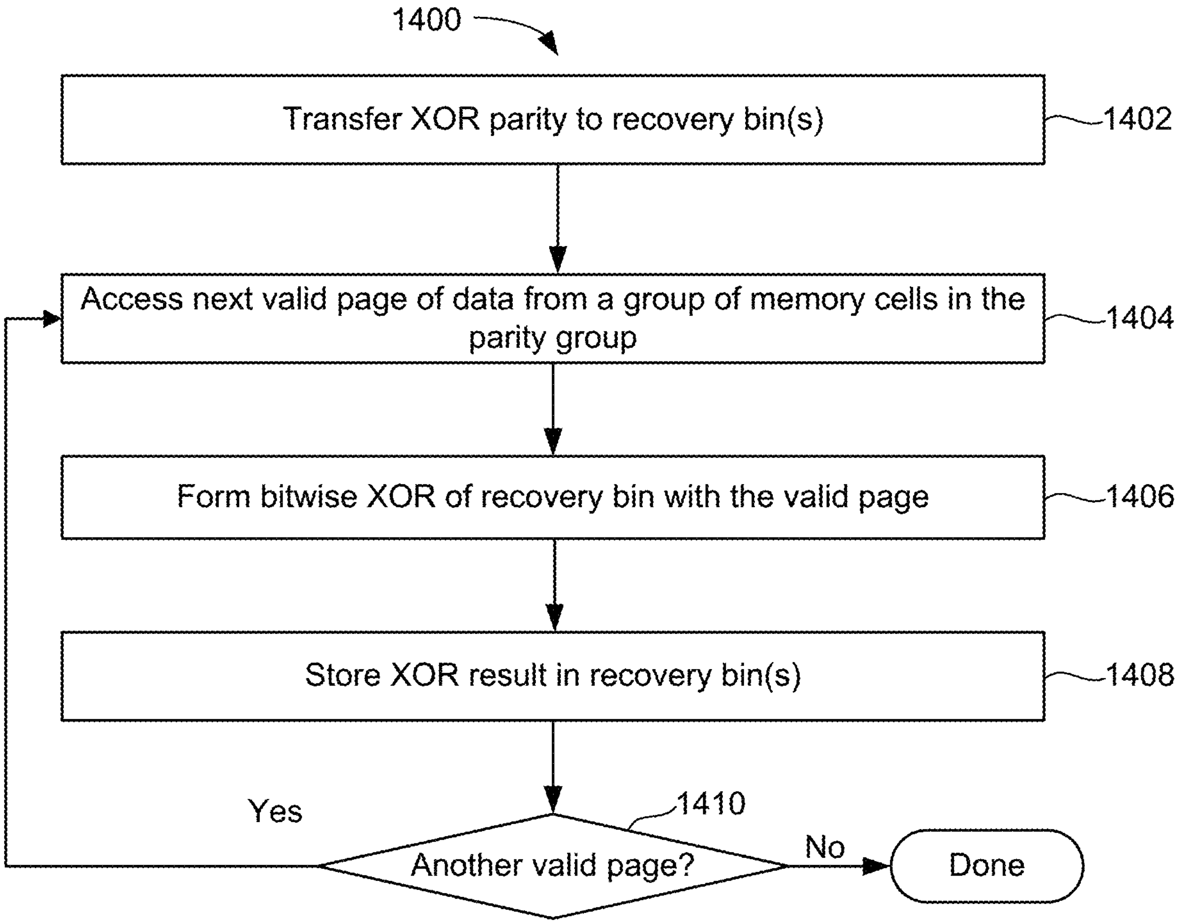
FIG. 14 is a flowchart of one embodiment of a process of using the parity data to recover user data.

FIG. 14 is a flowchart of one embodiment of a process 1400 of using the parity data to recover user data. Process 1400 may be used in the event that user data could not be decoded by the ECC engine 158 during a normal read that follows process 1000. Thus, prior to process 1400 the parity data has been stored in the parity group 804.

Step 1402 includes transferring XOR parity to a recovery bin (or bins) in, for example, local memory 140. For example, with respect to FIG. 9, the parity data at LWL 251 (WL 62, sub-block 3) is read. In an embodiment, the memory controller 120 sends a request to either memory die 200 or control die 211 to obtain the parity data. The die 200, 211 responds, in an embodiment, by sending one page of data for each page of parity data. For example, the die 200, 211 sends a lower page of parity data, a middle page of parity data, and an upper page of parity data. Each page may be in the form of one or more ECC codewords. The memory controller 120 may use the ECC engine 158 to decode and error correct the parity data. For the sake of explanation, an example of using three recovery bins (LP, MP, UP) be discussed.

Step 1404 includes accessing the next valid page of data from a group of memory cells in the parity group. An example will be discussed in which the user data at LWL 3 (WL0, sub-block 3) could not be decoded (see FIG. 9). Therefore, the next valid data is at LWL 19. In an embodiment, the memory controller 120 sends a request to either memory die 200 or control die 211 to obtain the next valid data. The die 200, 211 responds, in an embodiment, by sending one page of data for each page of next valid data. For example, the die 200, 211 sends a lower page of user data, a middle page of user data, and an upper page of user data. Each page may be in the form of one or more ECC codewords. The memory controller 120 may use the ECC engine 158 to decode and error correct the user data.

Step 1406 is a bitwise XOR between the contents of a recovery bin with a valid (and error corrected) page of user data. As noted, there could be more than one recovery bin such that the LP, MP, and UP are processed separately.

Step 1408 is to store the bitwise XOR result in the relevant recovery bin (e.g., LP, MP, or UP). Step 1408 processes all recovery bins (e.g., LP, MP, or UP). Step 1410 is a determination if there are more valid pages of user data. If so, the process returns to step 1404 to access the next page(s) of user data from the next group of memory cells in the parity group.

After all valid pages have been processed each recovery bin contains one recovered page (LP, MP, or UP) of user data. In the present example, the recovery bins contain the recovered user data for LWL 3 (WL0, sub-block 3).

A storage system has been described that manages parity data. The storage system is suitable for use with a memory structure that is unusually susceptible to errors in the stored data, such that decoding an ECC codeword has a relatively high chance of failure. The management of parity data allows the use of memory structures that have defects that could lead to errors in the stored data. Therefore, memory structures that might otherwise be discarded may be used. However, embodiments of management of parity data are not limited to such memory structures which are unusually susceptible to errors in the stored data.

In view of the foregoing, a first embodiment includes an apparatus, comprising one or more control circuits configured to control a memory structure that comprises non-volatile memory cells. The one or more control circuits are configured to program data into respective groups of the non-volatile memory cells. The one or more control circuits are configured to accumulate parity for the data in response to the data being programmed into the respective groups. The accumulated parity is based on the data programmed into each respective group. The one or more control circuits are configured to perform a post-program read test of each respective group after programming the data into the respective groups. The one or more control circuits are configured to, responsive to a determination that the post-program read test failed for a group of the non-volatile memory cells, re-calculate the parity such that the parity is no longer based on the data stored in the group that failed the post-program read test. The one or more control circuits are configured to program the re-calculated parity to a group of the non-volatile memory cells other than the respective groups.

In a second embodiment, in furtherance to the first embodiment, the one or more control circuits are further configured to, responsive to a determination that the post-program read test passed for each respective group, program the accumulated parity to the group of the non-volatile memory cells other than the respective groups, wherein the programmed parity is based on the data programmed into each respective group.

In a third embodiment, in furtherance to the first or second embodiments, the one or more control circuits are further configured to program any data that was programmed into the group that failed the post-program read test to non-volatile memory cells other than the respective groups.

In a fourth embodiment, in furtherance to any of the first to third embodiments, the one or more control circuits are configured to re-calculate the parity based on a logical combination of: i) the accumulated parity that is based on the data programmed into each respective group; and ii) the data that was programmed into the group that failed the post-program read test.

In a fifth embodiment, in furtherance any of the first to fourth embodiments, the one or more control circuits are configured to re-calculate the parity based on a bitwise XOR of the accumulated parity after programming the data into each respective group and the data that was programmed into the group that failed the post-program read test.

In a sixth embodiment, in furtherance to any of the first or to fifth embodiments, the one or more control circuits are configured to program parity to the group of the non-volatile memory cells other than the respective groups that is based on data programmed in n groups of the memory cells in response to the post-program read test passing for each respective group, wherein n is a positive integer. The one or more control circuits are configured to program parity to the group of the non-volatile memory cells other than the respective groups that is based on data programmed in n-m groups of the memory cells in response to the post-program read test failing for m of the respective groups, wherein m is a positive integer less than n.

In a seventh embodiment, in furtherance to any of the first to sixth embodiments, the one or more control circuits are configured use the programmed parity to recover the data in one of the respective groups of the non-volatile memory cells based on the data that was programmed in groups for which the post-program read test passed but not based on the data that was programmed in the group for which the post-program read test failed.

In an eighth embodiment, in furtherance to any of the first to seventh embodiments, the one or more control circuits are configured to verify whether memory cells in the respective groups have a threshold voltage at least as high as a target verify reference level for each respective memory cell when programming the data into the respective groups of the non-volatile memory cells. The one or more control circuits are configured determine whether memory cells in the respective groups have a threshold voltage between two read reference levels when performing the post-program read test.

In a ninth embodiment, in furtherance to the any of the first to eighth embodiments, the one or more control circuits are configured to program the data into respective groups of the non-volatile memory cells during a process that folds data stored at a single bit per memory cell in source groups of non-volatile memory cells to multiple bits per memory cell in the respective groups of the non-volatile memory cells.

In a tenth embodiment, in furtherance to the ninth embodiment, the one or more control circuits are configured to recover the data that was programmed into the group for which the post-program read test failed from the source groups of non-volatile memory cells.

In an eleventh embodiment, in furtherance to any of the first to tenth embodiments, the one or more control circuits are configured to: program the data into the respective groups of the non-volatile memory cells as error correction code (ECC) codewords; run a decoding algorithm as a part of the post-program read test to attempt to decode the ECC codewords; and determine that the post-program read test fails for any group of the non-volatile memory cells for which an ECC codeword is not successfully decoded.

One embodiment includes a method of operating non-volatile storage. The method comprises programming user data into n groups of non-volatile memory cells in a memory structure, including testing whether each respective memory cell has a threshold voltage at least as high as a target verify reference voltage for a target data state for each respective memory cell. The user data is programmed as error correction code (ECC) codewords. The method comprises accumulating parity data in non-transitory memory as the user data is being programmed into the n groups of non-volatile memory cells. The method comprises performing a post-program read test of each of the n groups of the memory cells that includes running a decoding algorithm to attempt to decode the ECC codewords. The method comprises re-calculating the parity data in the non-transitory memory based on the user data stored in n-m groups that passed the post-program read test responsive to m groups of non-volatile memory cells failing the post-program read test, wherein n is a positive integer, wherein m is a positive integer less than n. The method comprises programming the re-calculated parity data to a group of the non-volatile memory cells other than the n groups of memory cells.

One embodiment includes a non-volatile storage device comprising a plurality of semiconductor die, non-transitory memory, and one or more control circuits in communication with the non-transitory memory and the plurality of semiconductor die. Each semiconductor die comprises blocks of non-volatile memory cells. The one or more control circuits comprises means for programming data into respective groups of the non-volatile memory cells at multiple bits per memory cell. The one or more control circuits comprises means for accumulating, in the non-transitory memory, XOR parity for the data while the data is being programmed. The one or more control circuits comprises means for performing a post-program read test of each respective group after programming the data into the respective groups. The one or more control circuits comprises means for re-calculating the XOR parity based on a bitwise XOR between the XOR parity after programming each respective group with data that was programmed into a group of memory cells for which the post-program read test failed. The one or more control circuits comprises means for programming the re-calculated XOR parity to a group of the non-volatile memory cells other than the respective groups.

In an embodiment, the means for programming data into respective groups of the non-volatile memory cells at multiple bits per memory cell comprises one or more of memory controller 120, system control logic 260, column control circuitry 210, and/or row control circuitry 220. In an embodiment, the means for programming data into respective groups of the non-volatile memory cells at multiple bits per memory cell performs the process of FIG. 6. In an embodiment, the means for programming data into respective groups of the non-volatile memory cells at multiple bits per memory cell comprises one or more of a processor, FPGA, ASIC, integrated circuit, or other type of circuit.

In an embodiment, means for accumulating, in the non-transitory memory, XOR parity for the data while the data is being programmed comprises one or more of memory controller 120, system control logic 260, column control circuitry 210, and/or row control circuitry 220. In an embodiment, the means for accumulating, in the non-transitory memory, XOR parity for the data while the data is being programmed comprises performs the process of FIG. 11. In an embodiment, the means for accumulating, in the non-transitory memory, XOR parity for the data while the data is being programmed comprises one or more of a processor, FPGA, ASIC, integrated circuit, or other type of circuit.

In an embodiment, means for performing a post-program read test of each respective group after programming the data into the respective groups comprises one or more of memory controller 120, system control logic 260, column control circuitry 210, and/or row control circuitry 220. In an embodiment, means for performing a post-program read test of each respective group after programming the data into the respective groups comprises performs the process of FIG. 12. In an embodiment, the means for performing a post-program read test of each respective group after programming the data into the respective groups comprises one or more of a processor, FPGA, ASIC, integrated circuit, or other type of circuit.

In an embodiment, means for re-calculating the parity data based on the user data stored in n-m groups that passed the post-program read test responsive to m groups of non-volatile memory cells failing the post-program read test comprises one or more of memory controller 120, system control logic 260, column control circuitry 210, and/or row control circuitry 220. In an embodiment, means for re-calculating the parity data based on the user data stored in n-m groups that passed the post-program read test responsive to m groups of non-volatile memory cells failing the post-program read test comprises performs the process of FIG. 13. In an embodiment, the means for re-calculating the parity data based on the user data stored in n-m groups that passed the post-program read test responsive to m groups of non-volatile memory cells failing the post-program read test comprises one or more of a processor, FPGA, ASIC, integrated circuit, or other type of circuit.

In an embodiment, the means for programming the re-calculated XOR parity to a group of the non-volatile memory cells other than the respective groups comprises one or more of memory controller 120, system control logic 260, column control circuitry 210, and/or row control circuitry 220. In an embodiment, the means for programming the re-calculated XOR parity to a group of the non-volatile memory cells other than the respective groups performs the process of FIG. 6. In an embodiment, the means for programming the re-calculated XOR parity to a group of the non-volatile memory cells other than the respective groups comprises one or more of a processor, FPGA, ASIC, integrated circuit, or other type of circuit.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to control a memory structure that comprises non-volatile memory cells, wherein the one or more control circuits are configured to:

program data into respective groups of the non-volatile memory cells;

accumulate parity for the data in response to the data being programmed into the respective groups, wherein the accumulated parity is based on the data programmed into each respective group;

perform a post-program read test of each respective group after programming the data into the respective groups;

responsive to a determination that the post-program read test failed for a group of the non-volatile memory cells, re-calculate the parity such that the parity is based on data stored in the groups that passed the post-program read test but not the data stored in the group that failed the post-program read test; and program the re-calculated parity to a group of the non-volatile memory cells other than the respective groups.

2. The apparatus of claim 1, wherein the one or more control circuits are further configured to:

responsive to a determination that the post-program read test passed for each respective group, program the accumulated parity to the group of the non-volatile memory cells other than the respective groups, wherein the programmed parity is based on the data programmed into each respective group.

3. The apparatus of claim 1, wherein the one or more control circuits are further configured to:

program any data that was programmed into the group that failed the post-program read test to non-volatile memory cells other than the respective groups.

4. The apparatus of claim 3, wherein the one or more control circuits are configured to re-calculate the parity based on a logical combination of:

i) the accumulated parity that is based on the data programmed into each respective group; and ii) the data that was programmed into the group that failed the post-program read test.

5. The apparatus of claim 1, wherein the one or more control circuits are configured to re-calculate the parity based on a bitwise exclusive OR (XOR) of the accumulated parity after programming the data into each respective group and the data that was programmed into the group that failed the post-program read test.

6. The apparatus of claim 1, wherein the one or more control circuits are configured to:

program parity to the group of the non-volatile memory cells other than the respective groups that is based on data programmed in n groups of the memory cells in response to the post-program read test passing for each respective group, wherein n is a positive integer; and program parity to the group of the non-volatile memory cells other than the respective groups that is based on data programmed in n−m groups of the memory cells in response to the post-program read test failing for m of the respective groups, wherein m is a positive integer less than n.

7. The apparatus of claim 1, wherein the one or more control circuits are further configured to:

use the programmed parity to recover the data in one of the respective groups of the non-volatile memory cells based on the data that was programmed in groups for which the post-program read test passed but not based on the data that was programmed in the group for which the post-program read test failed.

8. The apparatus of claim 1, wherein the one or more control circuits are configured to:

verify whether memory cells in the respective groups have a threshold voltage at least as high as a target verify reference level for each respective memory cell when programming the data into the respective groups of the non-volatile memory cells; and determine whether memory cells in the respective groups have a threshold voltage between two read reference levels when performing the post-program read test.

9. The apparatus of claim 1, wherein the one or more control circuits are configured to:

program the data into the respective groups of the non-volatile memory cells during a process that folds data stored at a single bit per memory cell in source groups of non-volatile memory cells to multiple bits per memory cell in the respective groups of the non-volatile memory cells.

10. The apparatus of claim 9, wherein the one or more control circuits are configured to:

recover the data that was programmed into the group for which the post-program read test failed from the source groups of non-volatile memory cells.

11. The apparatus of claim 1, wherein the one or more control circuits are configured to:

program the data into the respective groups of the non-volatile memory cells as error correction code (ECC) codewords;

run a decoding algorithm as a part of the post-program read test to attempt to decode the ECC codewords; and determine that the post-program read test fails for any group of the non-volatile memory cells for which an ECC codeword is not successfully decoded.

12. A method of operating non-volatile storage, the method comprising:

programming user data into n groups of non-volatile memory cells in a memory structure, including testing whether each respective memory cell has a threshold voltage at least as high as a target verify reference voltage for a target data state for each respective memory cell, wherein the user data is programmed as error correction code (ECC) codewords;

accumulating parity data in non-transitory memory as the user data is being programmed into the n groups of non-volatile memory cells;

performing a post-program read test of each of the n groups of the memory cells that includes running a decoding algorithm to attempt to decode the ECC codewords;

re-calculating the parity data in the non-transitory memory based on the user data stored in n−m groups that passed the post-program read test responsive to m groups of non-volatile memory cells failing the post-program read test, wherein n is a positive integer, wherein m is a positive integer less than n; and programming the re-calculated parity data to a group of the non-volatile memory cells other than the n groups of memory cells.

13. The method of claim 12, further comprising:

determining that the post-program read test fails for a tested group of the memory cells in response to a failure to decode an ECC codeword stored in the tested group.

14. The method of claim 12, wherein re-calculating the parity data comprises:

forming a bitwise exclusive OR (XOR) between the accumulated parity data after programming the n groups and the user data that was programmed in the group that failed the post-program read test.

15. The method of claim 12, further comprising:

recovering the user data that was programmed in the group of memory cells that failed the post-program read test from multiple groups of non-volatile memory cells that each store one page of user data.

16. A non-volatile storage system, comprising:

a plurality of semiconductor die, each semiconductor die comprising blocks of non-volatile memory cells;

non-transitory memory; and one or more control circuits in communication with the non-transitory memory and the plurality of semiconductor die, the one or more control circuits comprising:

means for programming data into respective groups of the non-volatile memory cells at multiple bits per memory cell;

means for accumulating, in the non-transitory memory, exclusive OR (XOR) parity for the data while the data is being programmed;

means for performing a post-program read test of each respective group after programming the data into the respective groups;

means for re-calculating the XOR parity based on a bitwise XOR between the XOR parity after programming each respective group with data that was programmed into a group of memory cells for which the post-program read test failed; and means for programming the re-calculated XOR parity to a group of the non-volatile memory cells other than the respective groups.

17. The non-volatile storage system of claim 16, wherein the one or more control circuits are configured to:

program the data that was programmed into the group of memory cells for which the post-program read test failed into a different group of memory cells.

18. The non-volatile storage system of claim 16, wherein the one or more control circuits are configured to:

program the data into respective groups of the non-volatile memory cells at multiple bits per memory cell during a process that folds data stored at a single bit per memory cell in source groups of non-volatile memory cells to the respective groups of the non-volatile memory cells.

19. The non-volatile storage system of claim 18, wherein the one or more control circuits are configured to:

access the data that was programmed into the group for which the post-program read test failed from the source groups of non-volatile memory cells.

20. The non-volatile storage system of claim 16, wherein the one or more control circuits are configured to:

program the data into the respective groups of the non-volatile memory cells as error correction code (ECC) codewords;

run a decoding algorithm as a part of the post-program read test to attempt to decode the ECC codewords; and determine that the post-program read test fails for any group of the non-volatile memory cells for which an ECC codeword is not successfully decoded.

* * * * *